(12) United States Patent
Wu et al.

(10) Patent No.: US 10,253,428 B2
(45) Date of Patent: Apr. 9, 2019

(54) LOCAL CARBON-SUPPLY DEVICE AND METHOD FOR PREPARING WAFER-LEVEL GRAPHENE SINGLE CRYSTAL BY LOCAL CARBON SUPPLY

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Tianru Wu, Shanghai (CN); Xuefu Zhang, Shanghai (CN); Guangyuan Lu, Shanghai (CN); Chao Yang, Shanghai (CN); Haomin Wang, Shanghai (CN); Xiaoming Xie, Shanghai (CN); Mianheng Jiang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 15/111,268

(22) PCT Filed: Jun. 4, 2015

(86) PCT No.: PCT/CN2015/080738
§ 371 (c)(1),
(2) Date: Nov. 1, 2016

(87) PCT Pub. No.: WO2016/169108
PCT Pub. Date: Oct. 27, 2016

(65) Prior Publication Data
US 2017/0130360 A1    May 11, 2017

(30) Foreign Application Priority Data

Apr. 20, 2015 (CN) .......................... 2015 1 0189745

(51) Int. Cl.
*C30B 25/00* (2006.01)
*C30B 25/18* (2006.01)
(Continued)

(52) U.S. Cl.
CPC .......... *C30B 25/186* (2013.01); *C01B 32/186* (2017.08); *C23C 14/165* (2013.01);
(Continued)

(58) Field of Classification Search
CPC ...... C01B 32/186; C30B 25/12; C30B 25/165
See application file for complete search history.

(56) References Cited

U.S. PATENT DOCUMENTS 5,560,779 A * 10/1996 Knowles ............... C23C 16/276
                                                                          118/715
5,589,000 A * 12/1996 Harms ..................... C23C 14/50
                                                                           118/715
(Continued)

FOREIGN PATENT DOCUMENTS

CN        1195378 A     10/1998
CN        1763913 A      4/2006
(Continued)

OTHER PUBLICATIONS

European Patent Office, English computer translation of CN103726027 (2018).*
(Continued)

*Primary Examiner* — Matthew J Song
(74) *Attorney, Agent, or Firm* — Oliff PLC

(57) ABSTRACT

The present disclosure provides a local carbon-supply device and a method for preparing a wafer-level graphene
(Continued)

single crystal by local carbon supply. The method includes: providing the local carbon-supply device; preparing a nickel-copper alloy substrate, placing the nickel-copper alloy substrate in the local carbon-supply device; placing the local carbon-supply device provided with the nickel-copper alloy substrate in a chamber of a chemical vapor-phase deposition system, and introducing a gaseous carbon source into the local carbon-supply device to grow the graphene single crystal on the nickel-copper alloy substrate. A graphene prepared by embodiments of the present disclosure has the advantages of good crystallinity of a crystal domain, simple preparation condition, low cost, a wider window of condition parameters required for growth, and good repeatability, which lays a foundation for wide application of the wafer-level graphene single crystal in a graphene apparatus and other fields.

20 Claims, 5 Drawing Sheets

(51) Int. Cl.
| | | |
|---|---|---|
| C23C 16/26 | (2006.01) | |
| C30B 29/02 | (2006.01) | |
| C23C 14/16 | (2006.01) | |
| C23C 14/35 | (2006.01) | |
| C23C 14/58 | (2006.01) | |
| C23C 16/02 | (2006.01) | |
| C23C 16/455 | (2006.01) | |
| C23F 17/00 | (2006.01) | |
| C25D 5/50 | (2006.01) | |
| C25F 3/22 | (2006.01) | |
| C30B 25/12 | (2006.01) | |
| C30B 25/16 | (2006.01) | |
| C25D 5/34 | (2006.01) | |
| C25D 7/06 | (2006.01) | |
| C01B 32/186 | (2017.01) | |
| C22F 1/08 | (2006.01) | |
| C25D 3/12 | (2006.01) | |

(52) U.S. Cl.
CPC .......... *C23C 14/35* (2013.01); *C23C 14/5806* (2013.01); *C23C 16/0227* (2013.01); *C23C 16/0281* (2013.01); *C23C 16/26* (2013.01); *C23C 16/455* (2013.01); *C23F 17/00* (2013.01); *C25D 5/34* (2013.01); *C25D 5/50* (2013.01); *C25D 7/0614* (2013.01); *C25F 3/22* (2013.01); *C30B 25/12* (2013.01); *C30B 25/165* (2013.01); *C30B 25/183* (2013.01); *C30B 29/02* (2013.01); *C22F 1/08* (2013.01); *C25D 3/12* (2013.01)

(56) References Cited

U.S. PATENT DOCUMENTS

| | | | | |
|---|---|---|---|---|
| 5,897,311 | A * | 4/1999 | Nishi | .................. C23C 16/4583 |
| | | | | 432/239 |
| 6,093,253 | A * | 7/2000 | Lofgren | ............ C23C 16/45504 |
| | | | | 117/104 |
| 7,368,398 | B2 | 5/2008 | Matsubara et al. | |
| 2006/0086463 | A1 | 4/2006 | Matsubara et al. | |
| 2011/0108609 | A1* | 5/2011 | Woo | ....................... B82Y 30/00 |
| | | | | 228/176 |

FOREIGN PATENT DOCUMENTS

| | | |
|---|---|---|
| CN | 101481796 A | 7/2009 |
| CN | 102001650 A | 4/2011 |
| CN | 103726027 A | 4/2014 |
| CN | 103924208 A | 7/2014 |

OTHER PUBLICATIONS

Jan. 7, 2016 International Search Report issued in International Patent Application No. PCT/CN2015/080738.

* cited by examiner

LOCAL CARBON-SUPPLY DEVICE AND METHOD FOR PREPARING WAFER-LEVEL GRAPHENE SINGLE CRYSTAL BY LOCAL CARBON SUPPLY

BACKGROUND OF THE PRESENT INVENTION

Field of Invention

The present invention belongs to the field of the preparation of a two-dimensional material, and particularly to a local carbon-supply device and a method for preparing a wafer-level graphene single crystal by local carbon supply.

Description of Related Arts

Graphene is a two-dimensional carbon-based material with a single atomic layer thickness. Previously, it was considered to be a hypothetical structure and not able to exist stably alone. Until 2004, British physicist successfully isolated the material and won the Nobel Prize in Physics, and then graphene formally stepped on the stage of history. The graphene has many advantages such as ultrahigh transmittance, superhardness, flexibility, an ultrahigh heat conductivity coefficient and ultrahigh Hall mobility, which make it have a wide application prospect in many fields. In recent years, it has become a hotspot of academic research, a focus of economic investment, and a strategic choice point of national economic transformation.

Many excellent properties of the graphene mainly refer to the graphene single crystal, because there are a large amount of grain boundaries, the excellent properties of the graphene are greatly reduced, which also limits the wide application of the graphene. Therefore, increasing the size of the graphene single crystal is the only way to reduce the grain boundaries of a graphene film and improve the excellent performance of the graphene. Currently, for the preparation of the large-size graphene single crystal, the scientists all over the world have made unremitting efforts to invent a variety of methods, such as a substrate polishing treatment method, a method of reducing the volatility of a copper substrate, a substrate high-temperature annealing treatment method, and so on, These methods remain at a millimeter level in the preparation of the graphene single crystal. Later, they invented a copper foil oxidation method, although its size reaches a centimeter level, a nucleation density of the graphene may not be further reduced because of an uncontrollable nucleation number of the graphene, and the growth of the single crystal may not be further realized; the repeatability of the large size single crystal may not be ensured due to the randomness of a nucleation point. In additions, the growth rate of the graphene single crystal is extremely slow, its growth time lasts from ten hours to several days. All these problems make it impossible to realize large-scale preparation, which seriously hinders its application in the field of microelectronics. Therefore, if it is possible to realize the control over a single nucleation and the rapid growth of the wafer-level hexagonal graphene single crystal with an excellent performance, it will have important strategic significance for the graphene single crystal with high performance to be widely used in microelectronics, a detector, a heterogeneous section, a new energy and other fields.

SUMMARY OF THE PRESENT INVENTION

In view of the drawbacks described above in the prior art, the present invention aims at providing a local carbon-supply device and a method for preparing a wafer-level graphene single crystal by local carbon supply, so as to realize a single nucleation center, the method for fast preparing the graphene single crystal is used for solving the problems of in slow growth, the uncontrollable nucleation number and a small size of the existing graphene single crystal.

To realize the above and other related objectives, the present invention provides a local carbon-supply device comprising a first substrate, a second substrate and a supporting unit;

The first substrate and the second substrate are distributed correspondingly up and down;

The support unit is adapted to support the first substrate and the second substrate and keep the first substrate and the second substrate at a certain distance;

The first substrate or the second substrate is provided thereon with a through hole.

As a preferable solution of the local carbon-supply device of the present invention, the supporting unit is located between the first substrate and the second substrate, one end of the supporting unit is contacted with the first substrate, and the other end thereof is contacted with the second substrate.

As a preferable solution of the local carbon-supply device of the present invention, the first substrate and the second substrate are a quartz piece or a ceramic piece.

As a preferable solution of the local carbon-supply device of the present invention, the through hole is positioned at a center of the first substrate or a center of the second substrate.

As a preferable solution of the local carbon-supply device of the present invention, the distance between the first substrate and the second substrate is 0.1 mm~5 mm; a diameter of the through hole is 0.2 mm-5 mm.

The present invention still provides a method for preparing a wafer-level graphene single crystal by local carbon supply, comprising the following steps:

providing a local carbon-supply device of the above solution;

preparing a nickel-copper alloy substrate, placing the nickel-copper alloy substrate in the local carbon-supply device;

placing the local carbon-supply device provided with the nickel-copper alloy substrate in a chamber of a chemical vapor-phase deposition system, facilitating the nickel-copper alloy substrate to be in a protective atmosphere constituted by a gas mixture of a reducing gas and an inert gas at a preset temperature, and introducing a gaseous carbon source into the local carbon-supply device to thereby grow the graphene single crystal on the nickel-copper alloy substrate.

As a preferable solution of the method for preparing the wafer-level graphene single crystal by the local carbon supply, a method for preparing the nickel-copper alloy substrate comprises:

providing a copper foil;

depositing a nickel layer on a surface of the copper foil to form a nickel-copper double-layer substrate by using an electroplating process, an evaporation process or a magnetron sputtering process;

annealing the nickel-copper double-layer substrate to form the nickel-copper alloy substrate.

As a preferable solution of the method for preparing the wafer-level graphene single crystal by the local carbon supply, a method for specifically annealing the nickel-copper double-layer substrate comprises: placing the nickel-copper double-layer substrate in the local carbon-supply device, placing the local carbon-supply device provided with the nickel-copper alloy double-layer substrate in the chamber of the chemical vapor-phase deposition system under a pressure of 20 Pa-$10^5$ Pa, annealing the nickel-copper double-layer substrate in the protective atmosphere constituted by a gas mixture of a hydrogen gas and an argon gas under a temperature of 900° C.-1,100° C. for 10 minutes-300 minutes; wherein a volume ratio of the hydrogen gas and the argon gas is 1:10-1:200.

As a preferable solution of the method for preparing the wafer-level graphene single crystal by the local carbon supply, the method also comprise a step of annealing the copper foil before depositing the nickel layer; the copper foil is annealed by introducing the gas mixture of the hydrogen gas and the argon gas under a normal pressure at a temperature of 1,000° C. to 1,080° C. for 10 minutes-300 minutes; wherein the volume ratio of the hydrogen gas and the argon gas is 1:2-1:30.

As a preferable solution of the method for preparing the wafer-level graphene single crystal by the local carbon supply, the method also comprises a step of electrochemically polishing the copper foil before annealing the copper foil.

As a preferable solution of the method for preparing the wafer-level graphene single crystal by the local carbon supply, the nickel-copper alloy substrate is positioned on a substrate corresponding to a substrate provided with a through hole, a center of the nickel-copper alloy substrate corresponds to the through-hole up and down.

As a preferable solution of the method for preparing the wafer-level graphene single crystal by the local carbon supply, in the nickel-copper alloy substrate, the proportion of the number of nickel atoms to the total number of nickel-copper atoms is 10%-20%, the proportion of the total number of the nickel atoms and copper atoms to the total number of atoms in the nickel-copper alloy substrate is more than 99.9%.

As a preferable solution of the method for preparing the wafer-level graphene single crystal by the local carbon supply, during a process of growing the graphene single crystal on the nickel-copper alloy substrate, a pressure in the chamber is 20 Pa-$10^5$ Pa; the preset temperature is 900° C.-1,100° C.; the reducing gas is the hydrogen gas, and the inert gas is the argon gas, a flow rate of the hydrogen gas is 5 sccm-200 sccm, a flow rate of the argon gas is 300 sccm-2000 sccm; a flow rate of the gaseous carbon source is 5 sccm-100 sccm; growth time lasts 10 minutes-180 minutes.

As a preferable solution of the method for preparing the wafer-level graphene single crystal by the local carbon supply, during a process of growing the graphene single crystal on the nickel-copper alloy substrate, the flow rate of the gaseous carbon source varies in a gradient: the flow rate of the gaseous carbon source is 5 sccm-8 sccm at the beginning of the growth, after that, the flow rate of the gaseous carbon source is increased by 3 sccm-5 sccm every half hour.

As a preferable solution of the method for preparing the wafer-level graphene single crystal by the local carbon supply, the gaseous carbon source is any one of gaseous carbon-containing organic substances such as methane, ethylene, acetylene, propane, propylene, or propyne etc., or a combination thereof, which are diluted with the inert gas to have a concentration of 0.1%-1%.

As a preferable solution of the method for preparing the wafer-level graphene single crystal by the local carbon supply, the method also comprises a process of cooling the gas mixture of the hydrogen gas and the argon gas under the normal pressure after the completion of the growth, wherein the volume ratio of the hydrogen gas and the argon gas is 1:10-1:400.

As shown in the above, the present invention provides a local carbon-supply device and a method for preparing a wafer-level graphene single crystal by local carbon supply, comprising the following steps of: firstly, preparing a nickel-copper alloy foil as a substrate, placing the substrate in a chemical vapor-phase deposition chamber, keeping a temperature of the substrate at 950° C.-1,100° C., and introducing a unique local carbon technology to enable the nucleation control over the graphene single crystal. A method for increasing a flow rate of a methane gas with gradient is used to control a rapid and controllable growth of the graphene single crystal and suppress a generation of a secondary nucleation. Meanwhile, a protective gas is introduced to grow the graphene single crystal for 10 minutes-3 hours, the graphene single crystal having a size of up to an inch level is prepared on a surface of a nickel-copper alloy foil substrate. The introduction of the unique local carbon technology enables the control over the nucleation of the graphene single crystal, the size of a prepared hexagonal graphene single crystal may be up to an inch level, the prepared graphene features good crystallinity of a crystal domain, simple preparation conditions, low cost, a wider window for a condition parameter required for its growth, good repeatability, an excellent electrical property of the single crystal and Hall mobility of 13,000 cm2/vs; With the help of the local carbon-supply device, the hexagonal graphene single crystal with different sizes may be prepared by adjusting the relevant design sizes of the local carbon-supply device and a growth parameter of the graphene in a preparation process, which lays a foundation for a wide range of applications of the wafer-level graphene single crystal in a graphene apparatus and other fields.

Figure 1:
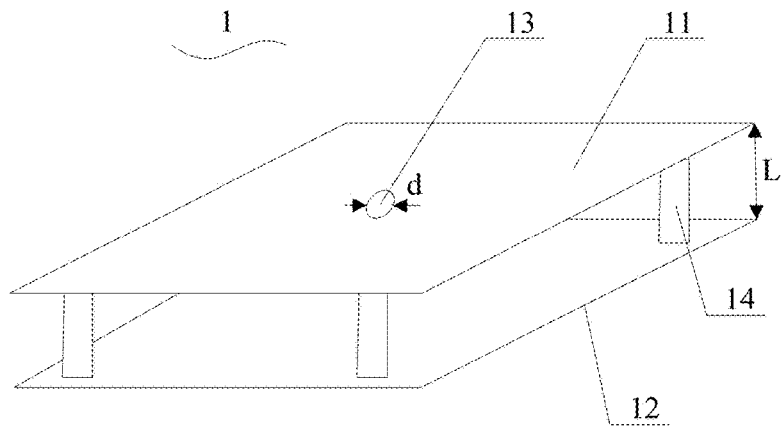
FIG. 1 shows a structure diagram of a local carbon-supply device of the present invention.

| Illustrations of reference numerals | |
|---|---|
| 1 | Local carbon-supply device |
| 11 | First substrate |
| 12 | Second substrate |
| 13 | Through hole |
| 14 | Supporting unit |
| d | Diameter of the through hole |
| L | Distance between a first substrate and a second substrate |

DETAILED DESCRIPTION OF THE PREFERRED EMBODIMENTS

The embodiments of the invention will be described below by way of specific examples, and other advantages and effects of the invention will be readily apparent to one skilled in the art from the disclosure of this specification. The present invention may also be practiced or applied through additional different specific embodiments, various modifications or changes may also be made to various details in this specification based on various views and applications without departing from the spirit of the invention.

Please refer to FIGS. 1 to 11. It shall be noted that the illustrations provided in the present examples illustrate the basic concept of the present invention only in a schematic manner. Although only the components related to the present invention are shown in the drawings rather than the number, shape and dimensions of the components at the time of actual implementation, the types, amounts and proportions of the components may be changed at will in a practical implementation, and their component layout type may also be more complex.

Refer to FIG. 1, the present example provides a local carbon-supply device 1 comprising a first substrate 11, a second substrate 12 and a supporting unit 14;

The first substrate 11 and the second substrate 12 are distributed correspondingly up and down;

The support unit 14 is adapted to support the first substrate 11 and the second substrate 12 and keep the first substrate 11 and the second substrate 12 at a certain distance L;

The first substrate 11 or the second substrate 12 is provided thereon with a through hole 13.

In one example, the supporting unit 14 is positioned between the first substrate 11 and the second substrate 12, one end of the supporting unit 14 is contacted with the first substrate 11, and the other end thereof is contacted with the second substrate 12; the supporting unit 14 may be a spacer.

In another example, the supporting unit 14 also may pass through the first substrate 11 and the second substrate 12 and fix the first substrate 11 and the second substrate 12 by means of a fixed device.

As an example, The number and distribution of the support units 14 may be set according to actual requirements, preferably, in the present example, the number of the support units 14 is four, and the support units 14 are distributed in the vicinity of four apexes of the first substrate 11 and the second substrate 12, respectively.

As an example, the first substrate 11 and the second substrate 12 are a quartz piece or a ceramic piece with high temperature resistance; thicknesses of the first substrate 11 and the second substrate 12 are 0.5 mm-3 mm.

As an example, the through hole 13 may be positioned on the first substrate 11 or the second substrate 12, FIG. 1 takes the through hole 13 positioned on the first substrate 11 as an example.

As an example, the through hole 13 is positioned at a center of the first substrate 11 or a center of the second substrate 12.

As an example, the distance between the first substrate 11 and the second substrate 12 is 0.1 mm-5 mm; a diameter of the through hole is 0.2 mm-5 mm.

The local carbon-supply device is suitable for a process for preparing the wafer-level graphene single crystal by the local carbon supply, the through-hole 13 is connected to a gaseous-source feed pipe as a channel conveying a gaseous source, to supply the gaseous source for the substrate located in the local carbon-supply device. In a process for preparing the graphene single crystal, a local carbon supply device is introduced, the introduction of the unique local carbon-supply technology enables the control over the nucleation of the graphene single crystal, the size of the prepared hexagonal graphene single crystal may be up to an inch level, and the hexagonal graphene single crystals with different sizes may be prepared by adjusting the relevant design size of the local carbon-supply device and a growth parameter of the graphene during a preparation process.

Figure 2:
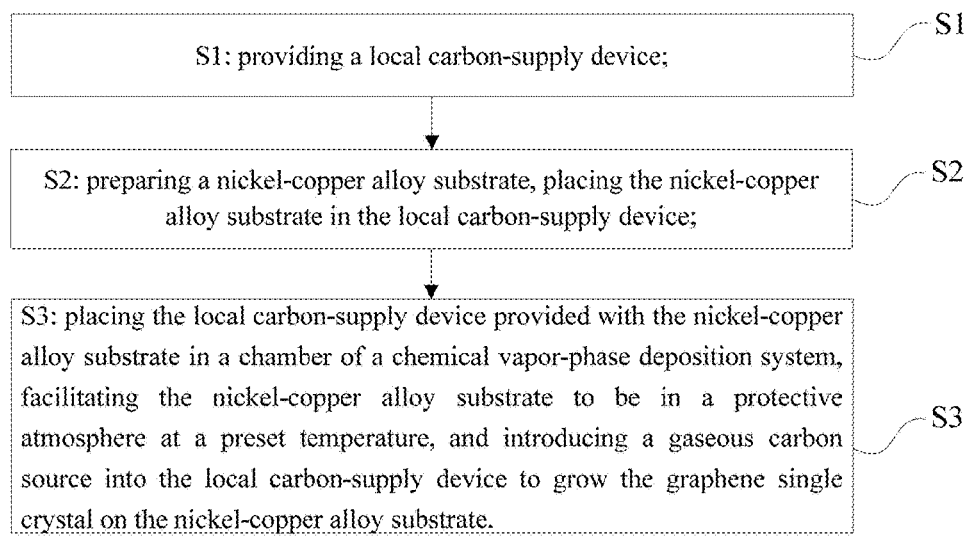
FIG. 2 shows a diagram of a flow chart of a method for preparing a wafer-level graphene single crystal by local carbon supply of the present invention.

Refer to FIG. 2, the present invention also provides a method for preparing a wafer-level graphene single crystal by local carbon supply, comprising at least the following steps:

S1: building the local carbon supply device in the above solution; wherein the two pieces of smooth quartz piece or other smooth high-temperature-resistance ceramic piece are fixed at four corners by a spacer and keep a certain distance therebetween, one through hole for conveying a gaseous carbon source and connecting a conveying pipe of the gaseous carbon source is provided at a top surface of the quartz pieces or at a middle position of other high-temperature-resistance materials.

S2: preparing a nickel-copper alloy substrate, placing the nickel-copper alloy substrate in the local carbon-supply device, and facilitating the through hole to just face the nickel-copper alloy substrate; wherein a method for specifically preparing the nickel-copper alloy substrate is as follows: First, an oxygen-free copper foil with a high purity of 99.99% and with a thickness of 5 μm~100 μm; the copper foil is electrochemically polished, washed and dried in sequence so that a surface roughness of the copper foil is less than 10 nm; second, the copper foil is annealed by introducing the gas mixture of a hydrogen gas with a high purity of 99.999% and an argon gas of a high purity of 99.999% under an atmospheric pressure at a temperature of 1,000° C. to 1,080° C. for 10 minutes-300 minutes; wherein a volume ratio of the hydrogen gas and the argon gas is 1:2-1:30; third, a nickel layer is deposited on a surface of the copper foil to form a nickel-copper double-layer substrate by using an electroplating process, an evaporation process or a magnetron sputtering process; finally, the nickel-copper double-layer substrate is placed in the local carbon-supply device, the local carbon-supply device provided with the nickel-copper alloy double-layer substrate is placed in the chamber of the chemical vapor-phase deposition system under a pressure of 20 Pa-$10^5$ Pa, the nickel-copper double-layer substrate is annealed in the protective atmosphere constituted by a gas mixture of the hydrogen gas with the high purity of 99.999% and the argon gas with the high purity of 99.999% at a temperature of 900° C.-1,100° C. for 10 minutes-300 minutes; wherein the volume ratio of the hydrogen gas to the argon gas is 1:10-1:200, the nickel-copper alloy substrate is formed; in the formed nickel-copper alloy substrate, the proportion of the number of nickel atoms to the total number of nickel-copper atoms is 10%-20%, the proportion of the total number of the nickel atoms and copper atoms to the total number of atoms in the nickel-copper alloy substrate is more than 99.9%.

S3: placing the local carbon-supply device provided with the nickel-copper alloy substrate in the chamber of the chemical vapor-phase deposition system under a pressure of 20 Pa-$10^5$ Pa, facilitating the nickel-copper alloy substrate to be in the protective atmosphere constituted by the gas mixture of the hydrogen gas and the argon gas at the temperature of 900° C.-1,100° C., and introducing the gaseous carbon source into the local carbon-supply device for ten minutes to thereby grow the wafer-level hexagonal graphene single crystal on the nickel-copper alloy substrate; wherein a flow rate of the hydrogen gas is 5 sccm-200 sccm, a flow rate of the argon gas is 300 sccm-2,000 sccm; the gaseous carbon source is any one of gaseous carbon-containing organic substances such as methane, ethylene, acetylene, propane, propylene, or propyne etc., or a combination thereof, which are diluted with the argon gas to a concentration of 0.1%-1%; a flow rate of the gaseous carbon source varies in a gradient: the flow rate of the gaseous carbon source is 5 sccm-8 sccm at the beginning of the growth, after that, the flow rate of the gaseous carbon source is increased by 3 sccm-5 sccm every half hour.

S4: closing the gaseous carbon source, and facilitating the nickel-copper alloy substrate to be naturally cooled to a room temperature in the gas mixture of the hydrogen gas and the argon gas under the atmospheric pressure, wherein the volume ratio of the hydrogen gas to the argon gas is 1:10-1:400.

A major innovation of the present invention is that the high quality wafer-level graphene single crystal is epitaxially grown on a surface of the nickel-copper alloy substrate by a chemical vapor-phase deposition method. In particular, the unique introduced local carbon technology enables the nucleation control over the graphene single crystal is achieved. A side length of the single crystal is by one order of magnitude larger than the existing one, the present invention has the advantages of simple preparation condition and low cost, and lays a good foundation for the application of the high quality graphite single crystal in a graphene apparatus and other fields.

Figure 3:
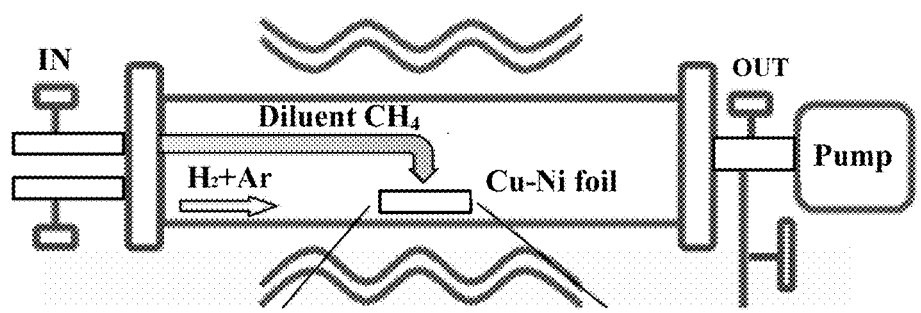
FIG. 3 shows a diagram of a device locally growing a graphene single crystal according to a method for preparing a wafer-level graphene single crystal by local carbon supply of the present invention.

In order to better describe the invention, the following detailed description will be given by specific examples. For better comparison and analysis, in the examples of the present invention, a wafer level is prepared by means of a chemical vapor-phase deposition manner by using methane as a carbon source, FIG. 3 is a diagram of a typical apparatus thereof. Alternatively, a liquid carbon-containing substance and a solid carbon-containing substance may also be used as the carbon source, since the chemical vapor-phase deposition process and the apparatus used therein are well known to one skilled in the art, they will not be repeated here.

Embodiment 1

First, preparing a nickel-copper alloy foil substrate, in the embodiment, a copper foil with a thickness of 25 μm is selected, preferably, a surface of the copper foil is polished by using a classical electrochemical polishing process. Wherein, for an electrochemical polishing liquid, a phosphoric acid solution with a volume ratio of 85% is selected, a current density was 0.2 A/cm$^2$, polishing time lasts 1 minute-2 minutes, after the end of the polishing, the copper foil is ultrasonically cleaned with acetone and isopropanol for 10 minutes, respectively, after that, the polished copper foil is blow-dried with a nitrogen gun, then, the clean copper foil with a surface roughness less than 50 nm and a thickness of about 20 m may be obtained.

The cleaned polished copper foil is then placed in a tube-type furnace as shown in FIG. 3 and annealed in an atmosphere of the hydrogen gas and the argon gas at a temperature of 1,050° C. under the atmospheric pressure for 2 hours. A flow rate of the argon gas is 300 sccm, and a flow rate of the hydrogen gas is 15 sccm.

By means of a classic Watt nickel plating process, and with a nickel sulfate as a plating solution, the above-mentioned polished and annealed copper foil is placed at a cathode, with the current density of 0.01 A/cm$^2$ nickel is electroplated for 15 minutes, a nickel film with a thickness of about 3 μm may be deposited on the surface of the copper foil to obtain a nickel-copper double-layer substrate.

The nickel-copper double-layer substrate prepared by the above-described method is placed in a chemical vapor-phase deposition chamber shown in FIG. 3 and annealed under the atmospheric pressure at a temperature of 1050° C. for 2 hours. The flow rate of the hydrogen gas is adjusted to be 15 sccm while the flow rate of the argon gas is adjusted to be 300 sccm. Upon the completion of the annealing, the nickel-copper alloy foil substrate containing about 15% of the nickel is prepared for growing the graphene single crystal.

After the completion of the annealing, the temperature of the nickel-copper alloy foil substrate is maintained at the temperature of 1,050° C., the pressure of the chamber is changed to be under the atmospheric pressure, meanwhile, the local carbon-supply device is introduced, a slim tube used as the local carbon-supply source and a methane gas with a concentration of 0.5% are introduced in the chamber, a flow rate of the initially diluted methane gas is 5 sccm-8 sccm, a method of increasing the flow rate of the methane gas by means of gradient is adopted, the flow rate of the diluted methane gas is increased by 3 sccm-5 sccm every half an hour. The argon gas and the hydrogen gas are used as carrier gases throughout the process, the flow rate of the argon gas is 300 sccm while the flow rate of the hydrogen gas is 15 sccm, the growth time of the graphene single crystal lasts 120 minutes.

After the completion of the growth, the methane gas source is closed, the substrate is taken out after the nickel-copper alloy foil substrate is naturally cooled to be a room temperature under the atmosphere of the argon gas and the hydrogen gas, with a proportion of the argon gas to the hydrogen gas of 20:1, then a graphene film may be characterized and applied.

In order that Raman and TEM (Transmission Electron Microscopy) are better characterized, it is sometimes necessary to transfer the prepared graphene film onto a substrate such as $S_iO_2/S_i$ or a copper mesh. A classic wet transfer process is used for carrying out the transfer: a PMMA gum with a thickness of about 200 nm is coated on the film, the nickel-copper alloy substrate is then etched away with a FeCl$_3$ solution, then, the PMMA-supported graphene film is picked up with the target substrate, finally, the PMMA is removed by using an organic solvent such as acetone and so on, after the completion of the transfer, the next characterization may be carried out.

Figure 4:
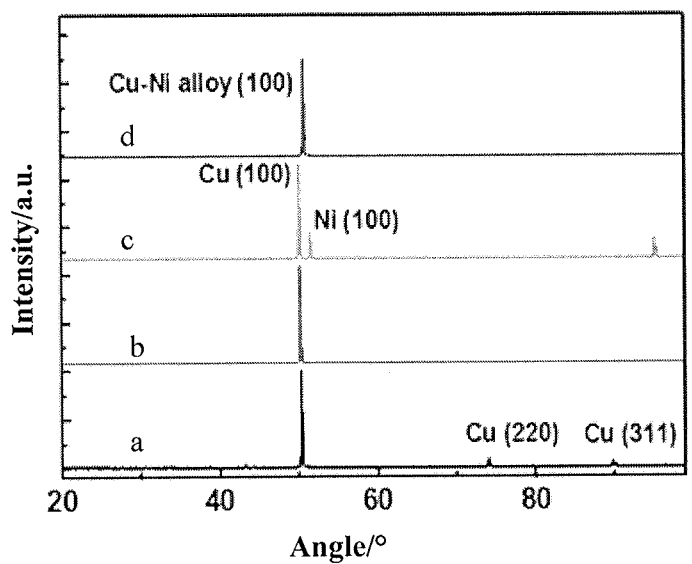
FIG. 4 shows an XRD graph of a surface of a nickel-copper alloy substrate before and after high-temperature annealing provided in embodiment 1 of the present invention.
Figure 5:
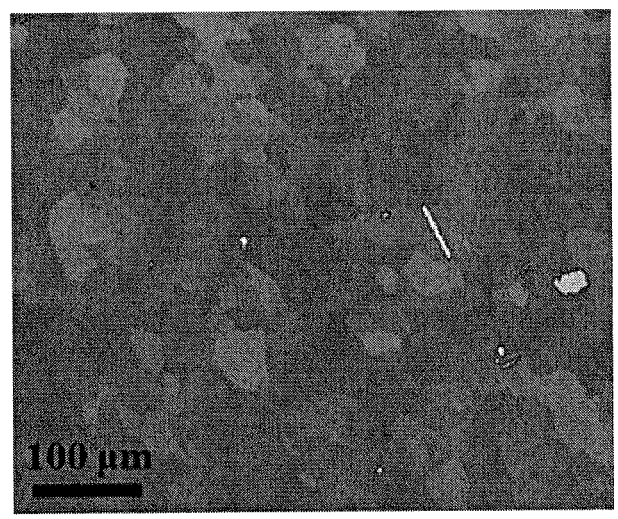
FIG. 5 shows an EBSD graph of a nickel-copper alloy substrate after high-temperature annealing provided in embodiment 1 of the present invention.
Figure 6:
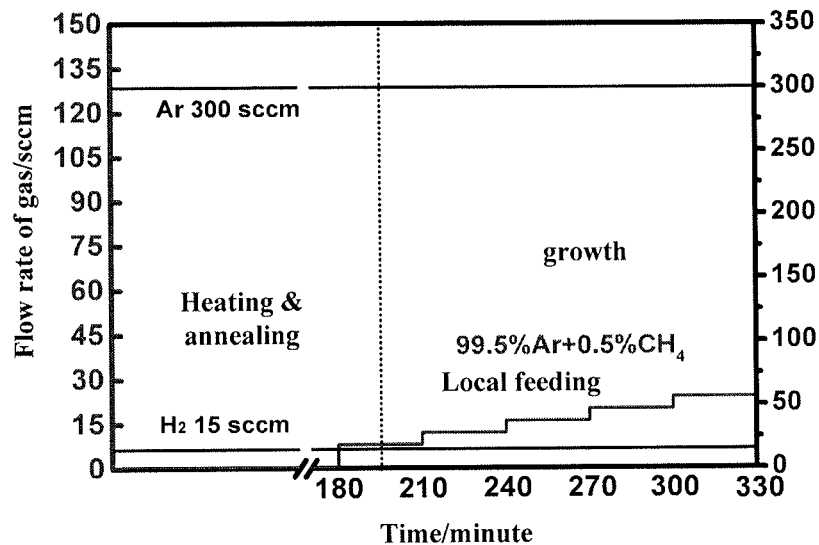
FIG. 6 shows a curve graph of a growth parameter of a graphene single crystal with local carbon-supply growth provided in embodiment 1 of the present invention.

Embodiment 1 has the following results: a local carbon-rich zone is formed on a near surface of the substrate by introducing a local carbon-supply technology, meanwhile, the nickel-copper alloy has a certain effect of a solution carbon. A high-active carbon at the near surface promotes the rapid growth of the graphene single crystal. Through a stable nickel-plating process, the copper-nickel double-layer substrate with a size of larger than 5 cm×5 cm and a uniform thickness may be obtained, an electrodeposited nickel layer exhibits equiaxed crystal growth. As shown in FIG. 4, the nickel and the copper are diffused with each other and fully alloyed after the nickel-copper double-layer substrate is annealed at a high temperature by means of an electroplating process, Curve a in FIG. 4 shows an XRD graph before the copper foil is annealed, Curve b is an XRD graph after the copper foil is annealed, Curve c is an XRD graph when the nickel-copper double-layer substrate is formed by electroplating the nickel layer on the copper foil, Curve d is an XRD graph of a nickel-copper alloy. As shown in FIG. 5, an EBSD test shows that a surface of the substrate exhibits a very uniform (100) crystal orientation after being annealed at a high temperature. FIG. 6 is a curve graph showing a variation of flow rates of a reaction gas and a carrier gas with time over an entire growth process of chemical vapor-phase deposition.

Embodiment 2

Embodiment 2 is distinct from Embodiment 1 in that: a growth temperature of a graphene film in Embodiment 1 is increased to be 1100° C. and growth time is prolonged to be 150 minutes. The remaining process parameters are the same as those of Embodiment 1.

Figure 7:
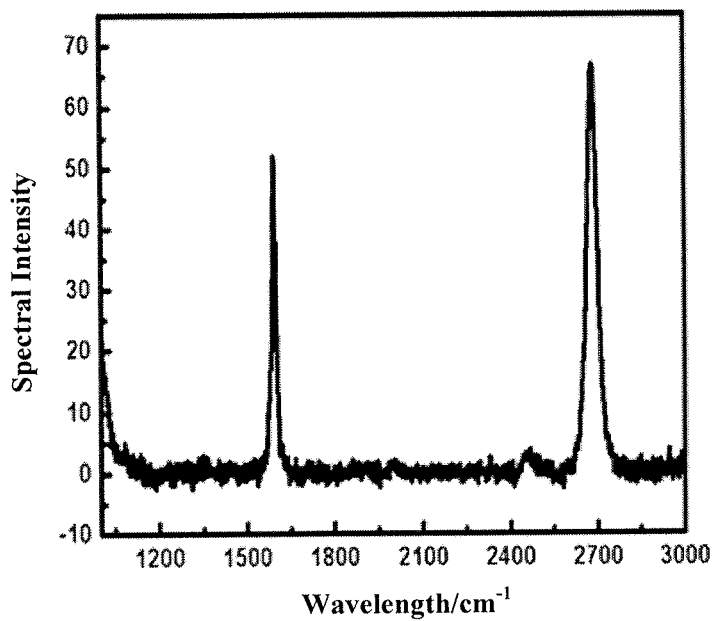
FIG. 7 shows Raman spectrum provided in embodiment 2 of the present invention that a wafer-level graphene single crystal growing on a nickel-copper alloy substrate is transferred onto $SiO_2$/Si.

Embodiment 2 has the following results: compared with Embodiment 1, a growth rate of a graphene single crystal is greatly promoted with an increase of a growth temperature. After the growth for 150 minutes, finally, a size of the graphene single crystal may reach 1.5 inch. After the oxidation of a nickel-copper alloy substrate, it can be clearly seen that a non-oxidized portion protected by a graphene exhibits a hexagonal shape. The graphene single crystal on a surface of the alloy substrate is transferred onto a Si substrate with a size of about 2 inches and a $S_iO_2$ oxide layer with a thickness of 300 nm at a surface thereof, the graphene single crystal in an inch level can also be observed by an optical microscope. As shown in FIG. 7, by analyzing Raman Graph within a crystal domain, a characteristic peak of a graphene is observed at places of ~1600 $cm^{-1}$ and ~2700 $cm^{-1}$, confirming that the grown crystal domain is the graphene single crystal.

Embodiment 3

Embodiment 3 is distinct from Embodiment 1 in that: the growth time of a graphene single crystal in Embodiment 1 is reduced to be 60 minutes, the remaining process parameters are the same as those of Embodiment 1.

Figure 8:
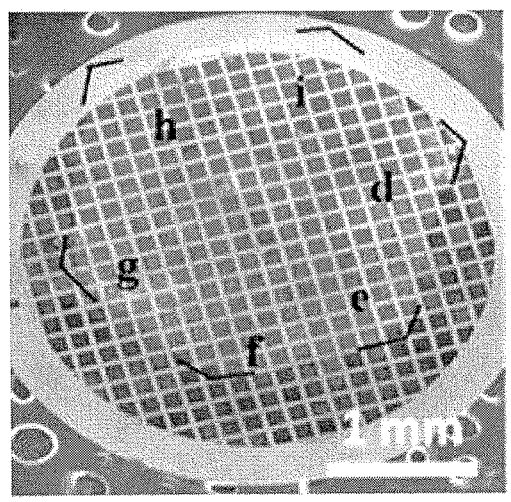
FIG. 8 shows an optical graph of a graphene single crystal transferred onto a copper mesh with a micro-grid provided in embodiment 3 of the present invention.
Figure 9:
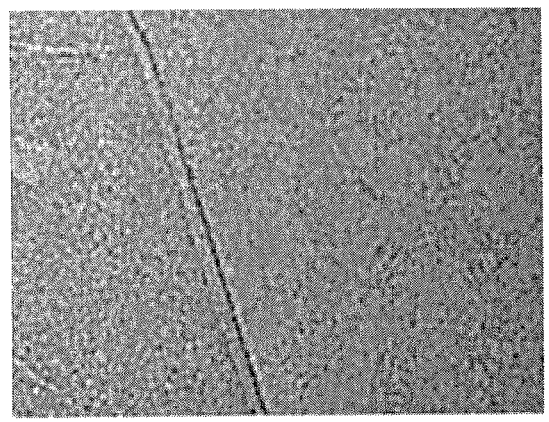
FIG. 9 shows a TEM graph of a graphene single crystal transferred onto a copper mesh with a micro-grid provided in embodiment 3 of the present invention.
Figure 10:
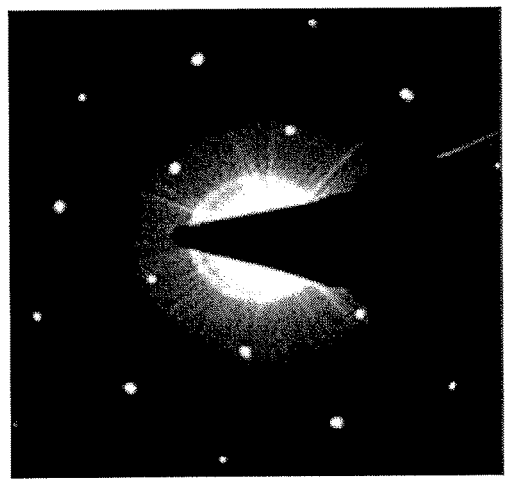
FIG. 10 shows a SAED spectrum of a graphene single crystal transferred onto a copper mesh with a micro-grid provided in embodiment 3 of the present invention.

Embodiment 3 has the following results: compared to Embodiment 1, it can be seen from FIG. 8-FIG. 10 that graphene is grown from a single nucleation point at the beginning of its growth. As shown in FIG. 8, after growing for 60 minutes, the graphene single crystal grown at the single nucleation point grows gradually to obtain the graphene single crystal with a size of 2-3 mm. As shown in FIG. 9, the prepared graphene single crystal is transferred onto a copper mesh with a micro-grid and subjected to TEM (Transmission Electron Microscope), and a high-resolution image of the graphene single crystal confirms that a grown crystal domain is in a monatomic layer. As shown in FIG. 10, a SAED (Selective Area Electron Diffraction) test is carried out at different positions on a surface of the graphene single crystal, it is found that a diffraction spot thereof is a perfect hexagonal lattice, which proves a hexagonal crystal-lattice structure of a film. Meanwhile, SAED diffraction spots at different positions show the same angle. It is further proved that the graphene single crystal grows from a single core at the beginning of its growth

Embodiment 4

Embodiment 4 is distinct from Embodiment 1 in that: the growth time of a graphene single crystal in Embodiment 1 is changed to be 90 minutes, the remaining processes are the same as those of Embodiment 1.

Embodiment 4 has the following results: a size of the graphene single crystal is further increased with an extension of growth time. There is no new graphene core formed during a growth process, through the introduction of a local carbon-supply technology, a continuous growth of the graphene single crystal with a signal core may be better controlled by adjusting a flow rate of a carbon source while inhibiting the generation of a secondary nucleation during its growth.

Embodiment 5

Embodiment 5 is distinct from Embodiment 1 in that: In this Embodiment, one nickel layer is deposited on a polished surface of a copper foil by a magnetron sputtering method and an electron beam evaporation method, respectively. Specifically, for the magnetron sputtering method, after the copper foil is polished and annealed, a sputtering power is adjusted to be 100 W and the copper foil is sputtered for about 200 min to form a nickel film having a thickness of about 3 μm on the copper foil; for the electron beam evaporation method, the weight of a nickel particle in a high purity is 0.8 g and evaporation time lasts 60 min, one layer of a nickel film having a thickness of about 3 m is deposited on a polished side of the copper foil to form a nickel-copper double-layer substrate. An alloy substrate obtained by these two different processes are placed in a chamber shown in FIG. 3 and annealed to form a nickel-copper alloy containing about nickel of about 15%. The remaining growth process parameters are the same as those of Embodiment 1.

Embodiment 5 has the following results: different nickel deposition processes may be used for the growth of the nickel-copper double-layer substrate in a large area. A surface of the alloy substrate obtained after annealing at a high temperature exhibits (100) preferred orientation. A large-size graphene single crystal may be obtained by the same growth process.

Embodiment 6

Embodiment 6 is distinct from Embodiment 1 in that: an elemental proportion of a double-layer nickel-copper alloy is changed, a graphene single crystal is grown on a nickel-copper alloy substrate containing nickel of about 10%. The remaining process parameters of annealing and growth are the same as those of Embodiment 1.

Embodiment 7

Embodiment 7 is distinct from Embodiment 1 in that: an elemental proportion of a double-layer nickel-copper alloy is changed, a graphene single crystal is grown on a nickel-copper alloy substrate containing nickel of about 20%. The remaining process parameters of annealing and growth are the same as those of Embodiment 1.

Figure 11:
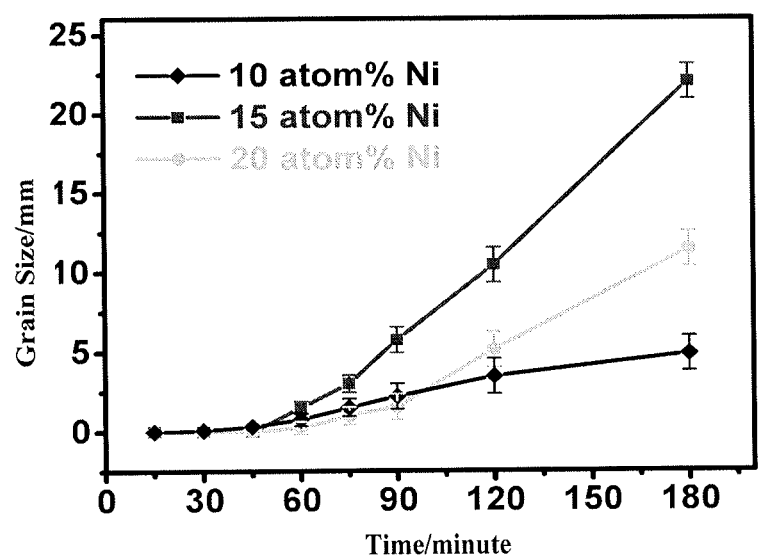
FIG. 11 shows a growth rate graph of a graphene on a nickel-copper alloy substrate with different nickel-containing proportions provided in embodiment 6 and embodiment 7 of the present invention.

Embodiment 6 and Example 7 have the following results: a nickel-copper alloy in different proportions has a significant impact on the nucleation and growth of a graphene single crystal, As shown in FIG. 11, since a surface of a nickel-copper alloy substrate containing a nickel of 10% has a relatively low carbon dissolution capacity, an incubation period required for nucleation is relatively short, meanwhile, because of a lower concentration of an active carbon on a deposition surface, a growth rate of a graphene single crystal is relatively slow, and with the prolonging of growth time, a growth rate of the single crystal is obviously lower than that of the single crystal in an initial period. For a nickel-copper alloy with a nickel content of 10%, a carbon-dissolving ability of the substrate is relatively high, and the active carbon on the surface is more likely to be dissolved further inside the substrate, which results in a long incubation period required for graphene nucleation. Similarly, since the active carbon for the growth of the graphene is reduced due to high carbon solubility ability of an inside portion of the substrate, a growth rate of the graphene single crystal is also reduced. However, the growth rate of the graphene single crystal is not decreased during the whole growth process.

In view of the above, the present invention provides a method for preparing a graphene film, comprising the following steps of: firstly, preparing a copper-nickel alloy foil as a substrate, placing the substrate in a chemical vapor-phase deposition chamber, keeping a temperature of the substrate at 950° C.-1,100° C., and introducing a unique local carbon technology to enable the control over the nucleation of the graphene single crystal. A method for increasing a flow rate of a methane gas with gradient is used to control a rapid and controllable growth of the graphene single crystal and suppress a generation of a secondary nucleation. Meanwhile, a protective gas is introduced to allow the single crystal to grow for 10 minutes to 3 hours, then, the graphene single crystal having a size of up to an inch level is prepared on a surface of the nickel-copper alloy foil substrate. A prepared graphene has the advantages of good crystallinity of a crystal domain, simple preparation condition, low cost, a wider window of condition parameters required for growth, and good repeatability, and lays a foundation for wide application of the wafer-level graphene single crystal in a graphene apparatus and other fields. Therefore, the present invention effectively overcomes the disadvantages in the prior art and has a high industrial utilization value.

The foregoing embodiments illustrate only the principles and efficacy of the invention and are not intended to limit the invention, for example, the present invention may also employ three epitaxial layers or multiple epitaxial layers. It will be apparent to one skilled in the art that various modifications or changes can be made in the above-described examples without departing from the spirit and scope of the invention. Accordingly, it is intended that the appended claims of the present invention cover all equivalent modifications or changes made by the ordinary one skilled in the art without departing from the spirit and technical idea of the present invention.

What is claimed is:

1. A local carbon-supply device for manufacturing graphene single crystal, comprising a first substrate, a second substrate and a supporting unit;
   the first substrate and the second substrate are distributed correspondingly up and down;
   the support unit is adapted to support the first substrate and the second substrate and keep the first substrate and the second substrate at a certain distance;
   the first substrate or the second substrate is provided thereon with a through hole,
   wherein the through hole is connected to a gaseous-source feed pipe as a channel conveying a gaseous source.

2. The local carbon-supply device according to claim 1, wherein the supporting unit is positioned between the first substrate and the second substrate, one end of the supporting unit is contacted with the first substrate, and the other end thereof is contacted with the second substrate.

3. The local carbon-supply device according to claim 1, wherein the first substrate and the second substrate are a quartz piece or a ceramic piece.

4. The local carbon-supply device according to claim 1, wherein the through hole is positioned at a center of the first substrate or a center of the second substrate.

5. The local carbon-supply device according to claim 1, wherein the distance between the first substrate and the second substrate is 0.1 mm-5 mm; the diameter of the through hole is 0.2 mm-5 mm.

6. A method for preparing a wafer-level graphene single crystal with the local carbon supply, wherein the method comprises:
   providing a local carbon-supply device according to claim 1;
   preparing a nickel-copper alloy substrate, placing the nickel-copper alloy substrate in the local carbon-supply device;
   placing the local carbon-supply device provided with the nickel-copper alloy substrate in a chamber of a chemical vapor-phase deposition system, facilitating the nickel-copper alloy substrate to be in a protective atmosphere constituted by a gas mixture of a reducing gas and an inert gas at a preset temperature, and introducing a gaseous carbon source into the local carbon-supply device to thereby grow the graphene single crystal on the nickel-copper alloy substrate.

7. The method for preparing the wafer-level graphene single crystal with the local carbon supply according to claim 6, wherein a method for preparing the nickel-copper alloy substrate comprises:
   providing a copper foil;
   depositing a nickel layer on a surface of the copper foil to form a nickel-copper double-layer substrate by using an electroplating process, an evaporation process or a magnetron sputtering process; and
   annealing the nickel-copper double-layer substrate to form the nickel-copper alloy substrate.

8. The method for preparing the wafer-level graphene single crystal with the local carbon supply according to claim 7, wherein a method for specifically annealing the nickel-copper double-layer substrate comprises: placing the nickel-copper double-layer substrate in the local carbon-supply device, placing the local carbon-supply device provided with the nickel-copper alloy double-layer substrate in the chamber of the chemical vapor-phase deposition system under a pressure of 20 Pa-$10^5$ Pa, annealing the nickel-copper double-layer substrate in the protective atmosphere constituted by a gas mixture of a hydrogen gas and an argon gas at a temperature of 900° C.-1,100° C. for 10 minutes-300 minutes; wherein a volume ratio of the hydrogen gas to the argon gas is 1:10-1:200.

9. The method for preparing the wafer-level graphene single crystal with the local carbon supply according to claim 7, wherein the method also comprise a step of annealing the copper foil before depositing the nickel layer; the copper foil is annealed by introducing the gas mixture of the hydrogen gas and the argon gas under a normal pressure at a temperature of 1,000° C. to 1,080° C. for 10 minutes-300 minutes; wherein the volume ratio of the hydrogen gas to the argon gas is 1:2-1:30.

10. The method for preparing the wafer-level graphene single crystal with the local carbon supply according to claim 9, wherein the method also comprises a step of electrochemically polishing the copper foil before annealing the copper foil.

11. The method for preparing the wafer-level graphene single crystal with the local carbon supply according to claim 6, wherein the nickel-copper alloy substrate is positioned on a substrate corresponding to a substrate provided with a through hole, a center of the nickel-copper alloy substrate corresponds to the through-hole up and down.

12. The method for preparing the wafer-level graphene single crystal with the local carbon supply according to claim 6, wherein in the nickel-copper alloy substrate, the proportion of the number of nickel atoms to the total number of nickel-copper atoms is 10%-20%, the proportion of the total number of the nickel atoms and copper atoms to the total number of atoms in the nickel-copper alloy substrate is more than 99.9%.

13. The method for preparing the wafer-level graphene single crystal with the local carbon supply according to claim 6, wherein during a process of growing the graphene single crystal on the nickel-copper alloy substrate, a pressure in the chamber is 20 Pa-$10^5$ Pa; the preset temperature is 900° C.-1,100° C.; the reducing gas is the hydrogen gas, and the inert gas is the argon gas, a flow rate of the hydrogen gas is 5 sccm-200 sccm, a flow rate of the argon gas is 300 sccm-2000 sccm; a flow rate of the gaseous carbon source is 5 sccm-100 sccm; growth time lasts 10 minutes-180 minutes.

14. The method for preparing the wafer-level graphene single crystal with the local carbon supply according to claim 13, wherein during a process of growing the graphene single crystal on the nickel-copper alloy substrate, the flow rate of the gaseous carbon source varies in a gradient: the flow rate of the gaseous carbon source is 5 sccm-8 sccm at the beginning of the growth, after that, the flow rate of the gaseous carbon source is increased by 3 sccm-5 sccm every half hour.

15. The method for preparing the wafer-level graphene single crystal with the local carbon supply according to claim 6, wherein the gaseous carbon source is one or more of gaseous carbon-containing organic substances, which are diluted with the inert gas to have a concentration of 0.1%-1%.

16. The method for preparing the wafer-level graphene single crystal with the local carbon supply according to claim 6, wherein the method also comprises a process of cooling the gas mixture of the hydrogen gas and the argon gas under the normal pressure after the completion of the growth, wherein the volume ratio of the hydrogen gas to the argon gas is 1:10-1:400.

17. A method for preparing a wafer-level graphene single crystal with the local carbon supply, wherein the method comprises the following steps:

providing a local carbon-supply device according to claim 2;

preparing a nickel-copper alloy substrate, placing the nickel-copper alloy substrate in the local carbon-supply device;

placing the local carbon-supply device provided with the nickel-copper alloy substrate in a chamber of a chemical vapor-phase deposition system, facilitating the nickel-copper alloy substrate to be in a protective atmosphere constituted by a gas mixture of a reducing gas and an inert gas at a preset temperature, and introducing a gaseous carbon source into the local carbon-supply device to thereby grow the graphene single crystal on the nickel-copper alloy substrate.

18. A method for preparing a wafer-level graphene single crystal with the local carbon supply, wherein the method comprises the following steps:

providing a local carbon-supply device according to claim 3;

preparing a nickel-copper alloy substrate, placing the nickel-copper alloy substrate in the local carbon-supply device;

placing the local carbon-supply device provided with the nickel-copper alloy substrate in a chamber of a chemical vapor-phase deposition system, facilitating the nickel-copper alloy substrate to be in a protective atmosphere constituted by a gas mixture of a reducing gas and an inert gas at a preset temperature, and introducing a gaseous carbon source into the local carbon-supply device to thereby grow the graphene single crystal on the nickel-copper alloy substrate.

19. A method for preparing a wafer-level graphene single crystal with the local carbon supply, wherein the method comprises the following steps:

providing a local carbon-supply device according to claim 4;

preparing a nickel-copper alloy substrate, placing the nickel-copper alloy substrate in the local carbon-supply device;

placing the local carbon-supply device provided with the nickel-copper alloy substrate in a chamber of a chemical vapor-phase deposition system, facilitating the nickel-copper alloy substrate to be in a protective atmosphere constituted by a gas mixture of a reducing gas and an inert gas at a preset temperature, and introducing a gaseous carbon source into the local carbon-supply device to thereby grow the graphene single crystal on the nickel-copper alloy substrate.

20. A method for preparing a wafer-level graphene single crystal with the local carbon supply, wherein the method comprises the following steps:

providing a local carbon-supply device according to claim 5;

preparing a nickel-copper alloy substrate, placing the nickel-copper alloy substrate in the local carbon-supply device;

placing the local carbon-supply device provided with the nickel-copper alloy substrate in a chamber of a chemical vapor-phase deposition system, facilitating the nickel-copper alloy substrate to be in a protective atmosphere constituted by a gas mixture of a reducing gas and an inert gas at a preset temperature, and introducing a gaseous carbon source into the local carbon-supply device to thereby grow the graphene single crystal on the nickel-copper alloy substrate.

* * * * *